United States Patent [19]
Gaul

[11] Patent Number: 5,814,889
[45] Date of Patent: Sep. 29, 1998

[54] INTERGRATED CIRCUIT WITH COAXIAL ISOLATION AND METHOD

[75] Inventor: Stephen Joseph Gaul, Melbourne, Fla.

[73] Assignee: Harris Corporation, Palm Bay, Fla.

[21] Appl. No.: 461,037

[22] Filed: Jun. 5, 1995

[51] Int. Cl.⁶ .................................................. H01L 27/00
[52] U.S. Cl. ........................... 257/773; 257/774; 257/750
[58] Field of Search .................................. 437/203, 915, 437/233, 974; 148/DIG. 164; 257/773, 750, 752, 774

[56] References Cited

U.S. PATENT DOCUMENTS

| | | |
|---|---|---|
| 3,256,465 | 6/1966 | Weissenstern et al. . |
| 3,343,256 | 9/1967 | Smith et al. . |
| 3,372,070 | 3/1968 | Zuk . |
| 3,418,545 | 12/1968 | Hutson . |
| 3,445,686 | 5/1969 | Rutz . |
| 3,454,835 | 7/1969 | Rosvold . |
| 3,456,335 | 7/1969 | Hennings et al. . |
| 3,462,650 | 8/1969 | Hennings et al. . |
| 3,648,131 | 3/1972 | Stuby . |
| 3,796,927 | 3/1974 | Boyle et al. . |
| 3,798,513 | 3/1974 | Ono . |
| 3,885,196 | 5/1975 | Fischer . |
| 3,959,579 | 5/1976 | Johnson . |
| 3,962,052 | 6/1976 | Abbas et al. . |
| 3,969,745 | 7/1976 | Blocker, III . |
| 3,982,268 | 9/1976 | Anthony et al. . |
| 4,074,342 | 2/1978 | Honn et al. . |
| 4,097,890 | 6/1978 | Morris et al. . |
| 4,104,674 | 8/1978 | Lorenze, Jr. et al. . |
| 4,188,709 | 2/1980 | Lorenze, Jr. et al. . |
| 4,263,341 | 4/1981 | Martyniak . |
| 4,275,410 | 6/1981 | Grinberg et al. . |
| 4,368,503 | 1/1983 | Kurosawa et al. . |
| 4,379,307 | 4/1983 | Soclof . |
| 4,467,343 | 8/1984 | Herberg . |
| 4,528,072 | 7/1985 | Kurosawa et al. . |
| 4,612,083 | 9/1986 | Yasumoto et al. ....................... 156/633 |
| 4,613,891 | 9/1986 | Ng et al. . |
| 4,670,764 | 6/1987 | Benjamin et al. . |
| 4,701,424 | 10/1987 | Mikkor ..................................... 437/209 |
| 4,720,738 | 1/1988 | Simmons . |
| 4,761,681 | 8/1988 | Reid . |
| 4,839,309 | 6/1989 | Easter et al. ............................. 437/160 |
| 4,839,510 | 6/1989 | Okabe et al. . |
| 4,862,322 | 8/1989 | Bickford et al. . |
| 4,897,708 | 1/1990 | Clements . |
| 4,935,800 | 6/1990 | Taguchi . |
| 4,954,875 | 9/1990 | Clements . |
| 4,982,266 | 1/1991 | Chatterjee . |
| 5,057,895 | 10/1991 | Beasom . |
| 5,196,920 | 3/1993 | Kumamoto et al. . |
| 5,198,695 | 3/1993 | Hanes et al. . |
| 5,268,326 | 12/1993 | Lesk et al. ................................. 437/62 |
| 5,317,183 | 5/1994 | Hoffman et al. ......................... 257/369 |
| 5,363,550 | 11/1994 | Aitken et al. . |
| 5,421,083 | 6/1995 | Suppelsa et al. . |
| 5,475,255 | 12/1995 | Joardar et al. . |

FOREIGN PATENT DOCUMENTS

| | | |
|---|---|---|
| 1-50543 | 2/1989 | Japan . |
| 3-232239 | 10/1991 | Japan . |

OTHER PUBLICATIONS

Stanley Wolf, Silicon Processing for the VLSI Era vol. 2 (1992) Lattice Press California, pp. 546–547.

*Primary Examiner*—Caridad Everhart
*Attorney, Agent, or Firm*—Jaeckle Fleischmann & Mugel, LLP

[57] ABSTRACT

A die 810 has an outer, annular via 814 filled with conductive material in order to electrically shield an inner via 816. A die 820 can be electrically shielded from another area 822 by use of a wall 823 having a trench with oxidized side walls and a conductive filling.

6 Claims, 9 Drawing Sheets

INTERGRATED CIRCUIT WITH COAXIAL ISOLATION AND METHOD

This application is relating to copending applications Ser. Nos. 08/462,171, 08/461,951; 08/461,643; 08/463,388; 08/462,876 (attorney docket nos. SE966 (H5984) 19910/330, SE1131TD (H6154) 19910/680, SE1132TD (H6155) 19910/690, SE1134TD (H6157) 19910/710, SE1135TD (H6158) 19910/720 filed Jun. 5, 1995 and assigned to Harris Corporation now U.S. Pat. Nos. 5,618,752; 5,646,067; 5,608,264; 5,668,409; and 5,682,062.

BACKGROUND

Integrated circuits are formed upon semiconductor substrates known as wafers. A wafer holds a number of identical integrated circuits, each circuit being a die that is spaced from other identical circuits. Dies are separated from the wafer usually by a dicing operation. In the dicing operation wafers are mounted on an adhesive film and the wafer is placed in a diamond saw apparatus. The diamond saw apparatus cuts the wafer to separate the dies from each other.

After separation from the wafer individual die are ready for packaging or for otherwise connecting one die to another to form a desired system or device. To package the die, each die is removed from the adhesive substrate and placed on a lead frame. A lead frame includes a plurality of finger-like connections that extend from the periphery of the lead frame toward a center die pad. The die is mounted on the center die pad. Next, wire bonds are formed between bond pads on the die and the lead fingers of the lead frame. Thereafter, the individual die are encapsulated in plastic during a molding operation. As an alternative, the lead frame with the attached die may be mounted in a ceramic package which is then hermetically sealed. Still another alternative is to directly mount the die onto a printed circuit board that contain other die which are interconnected to form an electronic system, such as a computer.

One technique for surface mounting dies on printed circuit boards uses a solder-bump interconnection. With that technique, the bond pads of the die have solder bumps or other wettable metal terminals deposited on the bond pads of the die. The die is mounted face side down onto a printed circuit board where the solder bumps of the die are aligned to electrical contacts on the board. In a typical application, the electrical contacts are metal lands that are recessed between raised glass walls. The solder-bump forms a collapsible wall of solder. The glass dam material helps retain the solder when the solder is heated.

Such surface mountable techniques can be used without packaging the die in protective plastic or ceramic encapsulating material. As such, surface mountable techniques reduce the number of steps in fabrication of electronic systems such as computers. However, one of the drawbacks with current surface mountable techniques is that the printed circuit board receives only a single layer of die.

Accordingly, there is a need for a surface mountable technique with higher die density and multiple layers of die. In particular, there is a need for surface mounted technique and surface mounted devices which are stackable, one on top of the other. There is a need for a surface mounted technique and surface mounted apparatus where one die may be directly connected to another die using contacts on both the front and back surface of each die.

SUMMARY OF THE INVENTION

The invention provides a surface mountable integrated circuit and a method for fabricating surface mountable integrated circuits and for interconnecting surface mountable integrated circuits. The method of fabrication begins with a wafer of semiconductor material having first and second surfaces. Integrated circuits are formed in the first surface of the wafer. Vias are formed in the wafer. The vias extend from an open end adjacent the first surface into the wafer. The vias terminate at a second, closed end that is a controlled distance from the second surface of the wafer. The via is filled with a conductive material. The second surface of the wafer is removed to expose the filling of the via above the reduced second surface.

The side walls of the via are coated with an insulating or dielectric material. A layer of metal is deposited on top of the insulating or dielectric material. The metal may be deposited in two layers. A first layer is a barrier layer that will prevent migration of material into the via. A second or adhesion metal is deposited on the barrier metal. The adhesion metal sticks to both the barrier metal and to a third metal that fills the via. The third metal may be selectively deposited tungsten.

As such, the invention provides for an integrated circuit die made of semiconductor material. The die has first and second surfaces that are separated from each other by the body of semiconductor material. A conductive via extends from one end at the first surface of the die to its second end that is a controlled distance from the second surface of the die. The via has a layer of insulating or dielectric material on the wall of the via that is formed by the semiconductor material. The via is filled with a conductive material. The conductive material may be either metal or polysilicon. The via may extend a predetermined or controlled length beyond the second surface of the die. As an alternative, the conductive material may terminate inside the via a controlled depth beneath the second surface of the die. Thus, the surface mountable integrated circuit of the invention provides for conductive vias in the form of prongs which extend from the second or back surface of the die as well as conductive vias in the form of receptacles where the conductive material is disposed a predetermined distance from the second surface of the die. When the receptacle form of the invention is employed, the conductive material in the via may be suitably formed to receive a corresponding prong from another die or substrate. In this way, dies may be interconnected with each other or may be mounted on PC boards with suitable prongs or receptacles, as the case may be. So, a via may include a prong, a receptacle, or both, with the prong at one end of the via and the receptacle at the other end of the via.

The conductive material in the vias may be metal or may be polysilicon. The conductive vias of the invention may also be formed in a single, bulk wafer of silicon. As an alternative, the conductive vias may be formed in a bonded wafer that includes a device wafer bonded to a handle wafer by a suitable bonding layer such as a bonding oxide layer.

With the claimed invention it is also possible to form a coaxial connector directly on an integrated circuit. One advantage of a coaxial connector is that a signal provided to the integrated circuit is shielded to prevent noise from degrading the signal. With the coaxial connector of the invention, a first conductive via is formed in a die. A second, annular conductive via is formed around the central via and encircles or otherwise encloses it. A ring of semiconductor material separates the outer conductive via from the inner conductive via. The walls of the two vias are suitably insulated from the semiconductor material. The vias are held in place by the adhesion between the metal, the insulating material, and the semiconductor material.

The coaxial or shielded version of the invention is not limited to the annular embodiment. The noise prevention feature of the invention may also be implemented using a wall disposed across a predetermined boundary of the die. Thus, a wall can be constructed across a die that includes both digital and analog circuitry. The wall, filled with metal, can have the metal in the wall attached to a suitable ground. As such, analog signals on one side of the wall are shielded from digital signals on the other side of the wall.

DETAILED DESCRIPTION

FIRST EMBODIMENT OF THE INVENTION

Figure 1A:
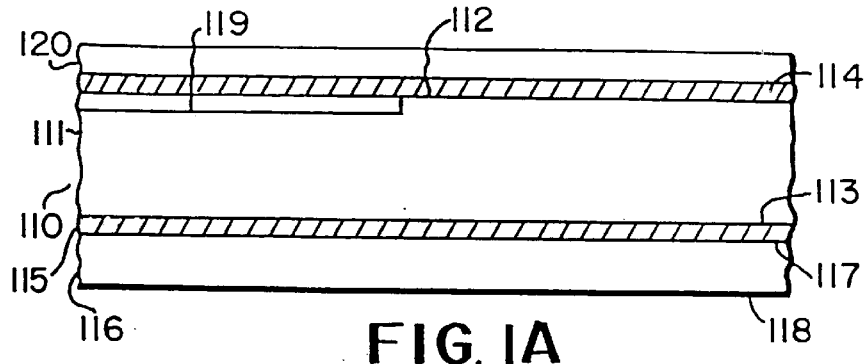
FIGS. 1A to 1K illustrate section views of an integrated circuit die processed according to a first embodiment of the invention.

With reference to FIG. 1A, there is shown a bonded wafer 110 having a device wafer 111 bonded to a handle wafer 116 by a bonding layer 115. In a preferred embodiment, the device wafer 111 is a wafer of monocrystalline silicon, the handle wafer is also made of silicon, and the bonding layer 115 is a layer of silicon dioxide. The device wafer 111 has one or more integrated circuit regions 119 formed in a first or upper surface 112. A second surface 113 is spaced from the first surface 112 by the thickness of the device wafer 111, which may range from several 1000Å to 10 mils or greater in thickness. The handle wafer 116 has a first handle surface 117 that faces the oxide bonding layer 115 and the second surface 113 of the device wafer 111. The second surface 118 of handle wafer 116 is spaced from the first surface 117 by the thickness of the handle wafer 116. The integrated circuit regions 119 are completed in so far as they are passivated with a surface oxide layer 114. In a preferred embodiment, integrated circuit devices are not yet interconnected with a metalization layer. A layer of photoresist 120 is uniformly deposited over the oxide layer 114.

Figure 1B:
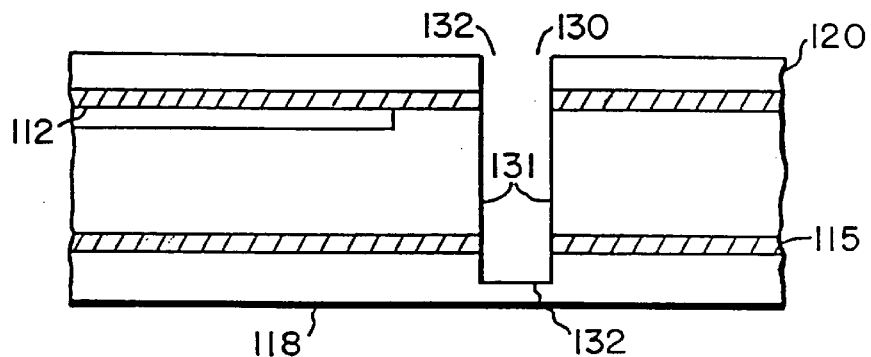

Turning to FIG. 1B, the photoresist layer 120 is patterned to define via openings 130. After the photoresist is removed from the via area 130, the via 130 is suitably etched by using a plasma etch with a $CF_4$ or $CHF_3+O_2$ chemistry, for example, to remove the exposed portion of the oxide layer 114 and a plasma etch with a $NF_3$, HBr/Cl or $SF_6$ chemistry, for example, to remove the silicon in the device wafer 111. The via 130 extends to or through the bond oxide layer 115 by again using an oxide plasma etch process, if necessary. The via 130 has a first end 132 that is open on the first surface 112 of the device wafer 111. The via has the side wall 131 that defines the length of its opening and has a second end 132. The second end 132 of the via 130 terminates at a predetermined distance from the second surface 118 of the handle wafer 116.

Figure 1C:
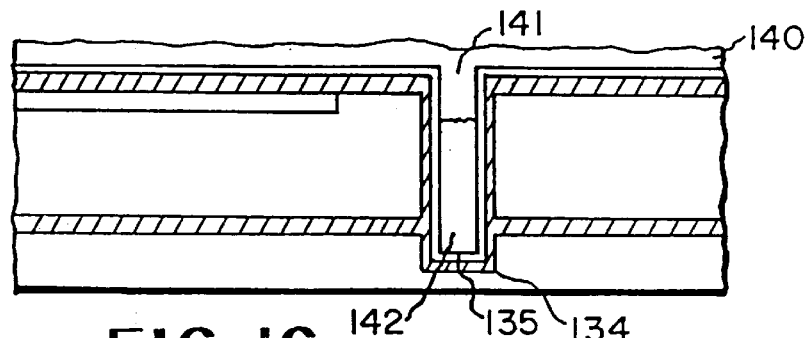
Figure 1D:
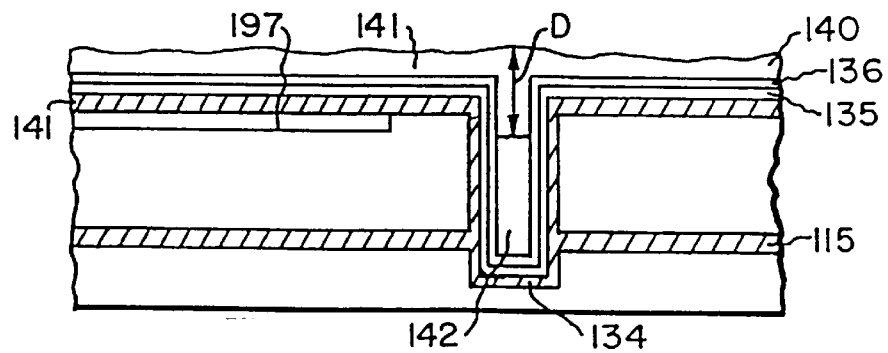

As a next step shown in FIG. 1C, the photoresist 120 is stripped and the side wall 131 and second end 132 of via 130 is deposited with the oxide layer 134. The oxide 134 can be thermally grown, provided that the integrated circuit devices are not adversely affected by the additional high temperature processing, or deposited at low temperature using chemical vapor deposition (CVD). A barrier metal 135 is then deposited on top of the oxide layer 134. In the preferred embodiment barrier metal 135 comprises titanium nitride (TiN) deposited using CVD to a thickness in the range of 100 to 1000Å. It may also be possible to deposit other barrier metals such as Cu, Pd, Pt or Ni using sputtering or evaporation provided the deposition method is capable of coating inside the via 130. This is an reasonable option for shallow (several microns) trenches with aspect ratios (trench depth/trench width) of approximately 1 or less. If a barrier metal other than TiN is utilized, an adhesion layer 136 (see FIG. 1D) may also be needed. Typical adhesion metals include chromium, titanium and titanium tungsten. The adhesion layer 136 is deposited using sputtering or evaporation within the same constraints as previously discussed for barrier metals other than TiN. Both barrier and adhesion metals are deposited to a thickness of approximately 1000Å. In the preferred embodiment, a single layer of TiN functions as both a barrier metal and adhesion layer.

Figure 1E:
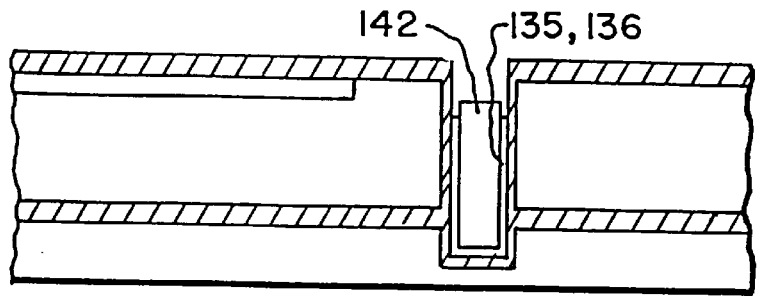
Figure 1F:
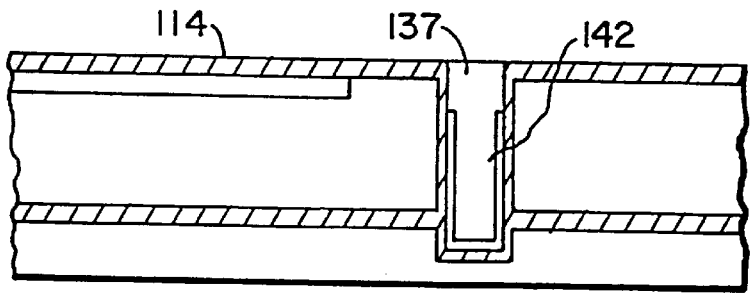

The deposition of barrier metal 135 and optional adhesion layer 136 is followed by a step (see FIGS. 1D) in which photoresist 140 is uniformly deposited on the surface of the device wafer 111 and fills all of the vias 130. The purpose of the photoresist 140 in the via 130 is to protect the adhesion metal 135 and optional barrier metal 136 in the bottom of the via 130. In the preferred embodiment, the photoresist is a positive resist so that exposure to ultraviolet radiation will soften the resist. The resist 140 is exposed to enough ultraviolet radiation to soften the resist to a predetermined depth D below the first surface 112 of the device wafer 111. The softened photoresist 141 is then removed using a development process, and barrier metal 135 and optional adhesion layer 136 are etched leaving only those portions that are protected by the undeveloped photoresist 142 in the vias 130. The TiN barrier/adhesion layer is etched using a wet etch of dilute hydrofluoric acid or a dry etch using $SF_6$ or $NF_3$ chemistry. As shown in FIG. 1E, the undeveloped photoresist 142 fills the lower portion of the via 130. The photoresist 142 is then removed from via 130 and selectively deposited metal 137, e.g. tungsten, fills via 130 as shown in FIG. 1F. The metal layer 137 is deposited to the surface of the oxide 114.

Figure 1G:
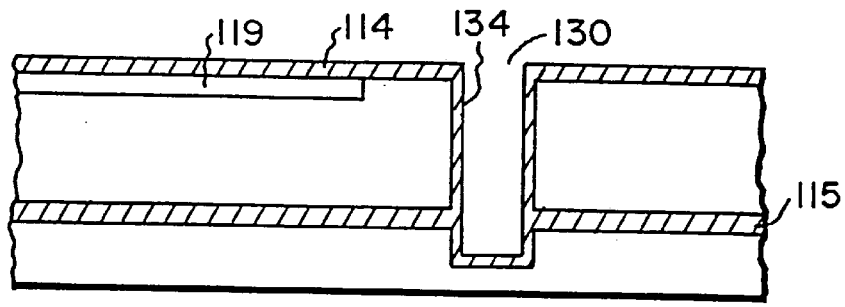
Figure 1H:
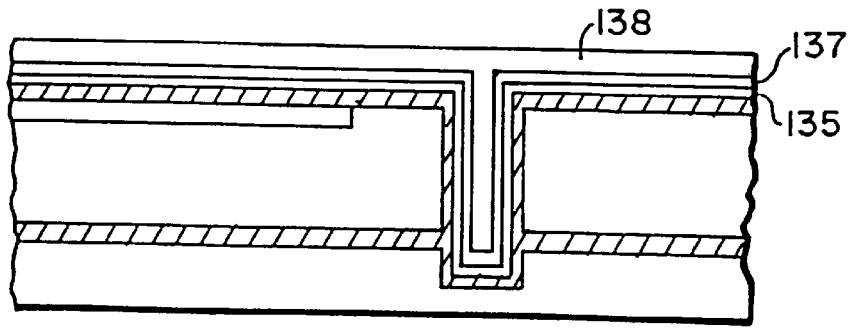
Figure 1I:
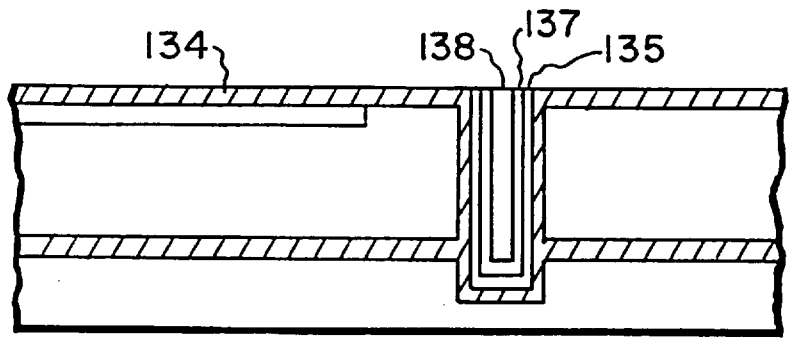

An alternate processing sequence for the via refill is shown in FIGS. 1G to 1I. This sequence could be used where the via width is wider than can be reasonably filled using a single selective deposition of metal 137 as shown in FIG. 1F and where the via has a high aspect ratio; i.e. depth: width is greater than 10:1. For example, selective deposition of tungsten is useful up to about 1 micron of deposited thickness. Thicknesses greater than 1 micron are prohibited by excessive film stress and the growth of tungsten in non-selective areas. This effectively limits the above described via refill process to vias of width less than about 3 microns, depending on the thickness of sidewall oxide 134 and barrier/adhesion metals 135, 136 respectively. For vias wider than 3 microns, an alternative refill process starts with the etched via 130 with sidewall oxide 134 as previously described, FIG. 1G. A barrier/adhesion metal 135 and metal 137 are then deposited using CVD. In the preferred embodiment, the barrier/adhesion metal 135 is titanium nitride (TiN) deposited to a thickness in the range of 100 to 1000Å, and the metal 137 is tungsten deposited to a thickness of approximately 1 micron. A planarizing layer 138, preferably LPCVD polysilicon, is then deposited, completely filling the via, FIG. 1H. The final step uses chemical/mechanical planarization (CMP) to remove surface regions of metals 135, 137 and planarizing layer 138 stopping on the oxide 134 so as to neatly refill the via 130, as shown in FIG. 1I.

Figure 1J:
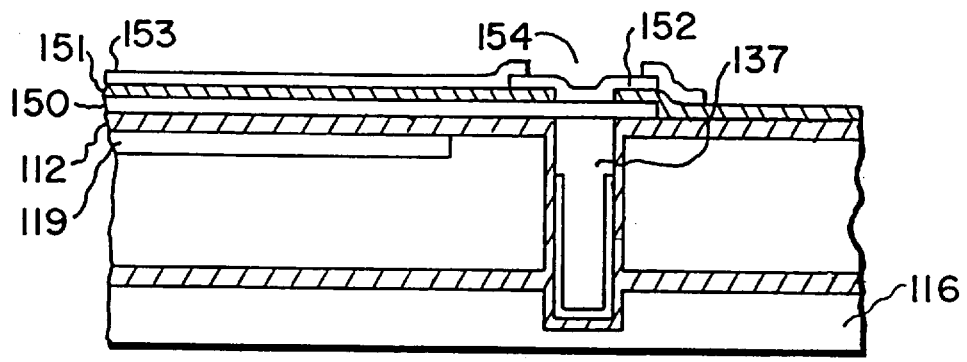

In a following step of the process which is applicable to vias refilled with either of the methods previously described, contacts to devices in the integrated circuit regions 119 are etched (not shown) This is followed by the deposition and patterning of a first metal interconnect layer 150 over the circuit area 119 and the via 139, as shown in FIG. 1J. The first metal interconnect layer 150 connects the tungsten 137 in the via 130 to an input/output terminal (not shown) of the circuit area 119. Above the first metal layer 150 is an interlevel dielectric layer 151, typically either a deposited oxide or a nitride layer. The interlevel dielectric layer 151 separates the first metal interconnect layer 150 from a second metal interconnect layer 152. Both interconnect metal layers 150, 152 serve in the normal fashion of connecting devices in the circuit region 119. After the deposition and patterning of the second metal layer 152, a passivating layer 153 is applied. Openings 154 in layer 153 may be etched which overlie metal layer 152. The openings 154 are analogous to bondpad regions of integrated circuits. Passivating layer 154 provides scratch resistance and durability for the metalization layers 150, 152, and may be formed from a deposited dielectric such as silicon dioxide or silicon nitride (or combinations thereof). Other passivating layers can include polyamide and spin-on glass (SOG).

Figure 1K:
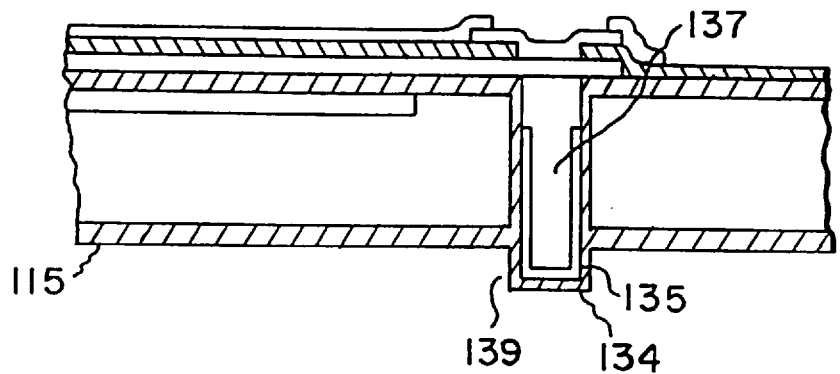

As a next step in the process, the handle wafer 116 is removed by etching the handle wafer 116 with KOH or other suitable silicon etchant. For thick handle wafers, mechanical removal techniques, such as polishing or abrasion, may be employed prior to application of the wet etchant. By removing the handle wafer 116, a portion 139 of the via 130 extends beyond the bonding layer 115 as shown in FIG. 1K.

The outer surface of the exposed portion 139 of the via will include a portion of the side wall oxide 134 which encloses a barrier metal 135. The side wall oxide layer 134 is removed by an oxide etch to expose the barrier metal 135. The side wall oxide 134 and a portion of the bond oxide 115 are removed by hydrofluoric etch. Once the barrier metal 135 is exposed, it may be coated with a suitable contact metal. Suitable contact metals include gold, aluminum and copper aluminum alloys. In one embodiment the exposed portion 139 of the filled via 130 is coated with a gold bump using electroless plating. The die on the device wafer 111 can then be separated in normal fashion by a diamond saw. Then, the separated die can be mounted right side up on multi-chip modules or on lead frames or any other suitable carrier device.

The first embodiment of the invention also has a number of variations. For example, the upper surface of each die may be coated with a polyamide or spin-on-glass (SOG) after the wafer is electrically probed and the good die are identified. Such a coating makes the die more durable for further handling after testing and for surface mounting of the die. In another variation, the region above the second metal interconnect layer 152 that is electrically in contact with the via 130 may be formed as a bond pad and may be open so that other die may be stacked on top of via 130 providing a via connection from one die to the next. Such a stackable type device is particularly useful for components such as dynamic random access memories. It is common that DRAMS are often assembled into modules comprising a plurality of identical DRAMS in order to provide a memory module for a system. So, for example, to add an additional one megabyte of memory where each word in memory comprises eight bits, it is common to assemble eight identical one megabyte memory chips together in a one megabyte memory module. Such memory modules are generally assembled on PC boards with one DRAM next to the other in a linear array on the PC board. With the invention, the DRAMS may be stacked one on top of the other and suitably interconnected to provide a one megabyte memory module.

It is a further feature of the invention that the height of the portion 139 of the via above the bond oxide layer 115 can be controlled to define the chip height between stacked chips. The latter facilitates cleaning of fluxes that are used during an attaching process.

SECOND EMBODIMENT OF THE INVENTION

Figure 2A:
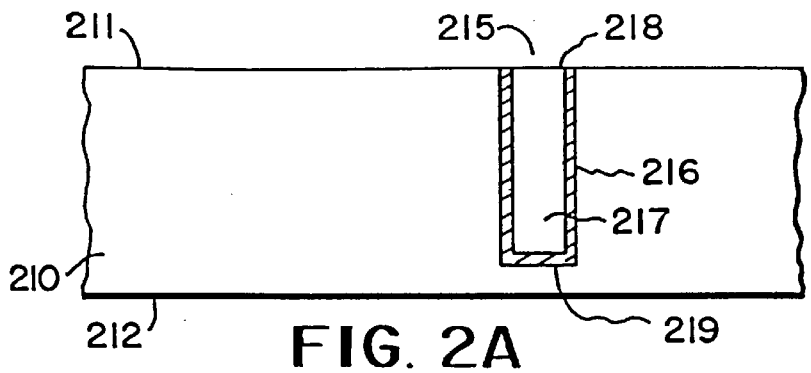
FIGS. 2A to 2D show section views of an integrated circuit die processed according to a second embodiment of the invention.
Figure 2B:
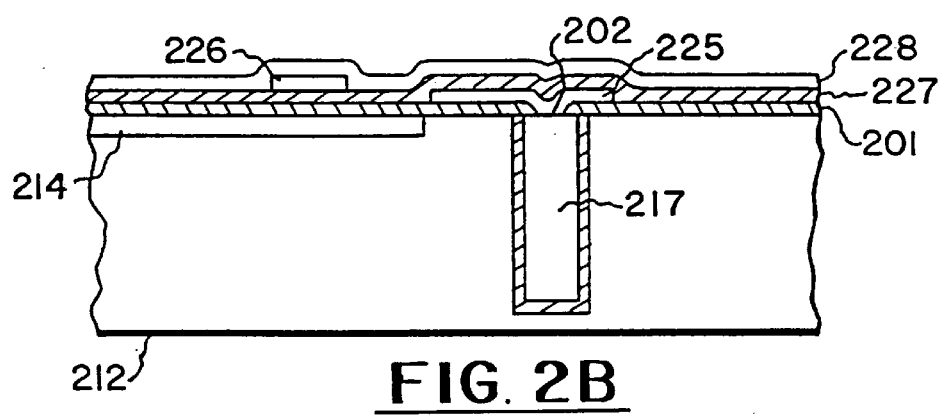

With reference to FIG. 2A, there is shown a bulk wafer 210 having a first surface 211 spaced from a second surface 212 by the thickness of the bulk wafer 210. In the bulk wafer 210 there is formed a via 215. The via 215 has a first end 218 open on the first surface 211 of the bulk wafer 210. A second end 219 of via 215 is disposed a predetermined or controlled distance from the second surface 212 of bulk wafer 210. The walls of the via 215 are coated with a side wall oxide 216. The via itself 215 is formed in a manner similar to the formation of the via 130 as explained in the prior discussion of the first embodiment of the invention. To that end, the first surface 211 of bulk wafer 210 is coated with a uniform layer of photoresist (not shown). The photoresist is patterned to define the first end opening 218 of the via 215. The silicon wafer 210 is suitably etched using the remaining photoresist as a mask to remove semiconductor material down to the second end 219 of the via 215. After removal of the photoresist mask, a side wall oxide 216 is formed by thermal oxidation or deposition or some combination thereof. The via 215 is then filled with conductive materials such as N type doped polysilicon 217.

Turning to FIG. 2—2, further processing steps known to those skilled in the art are used to form circuit area 214 in the first surface 211 of bulk wafer 210. Such integrated circuits may also be formed in an epitaxial layer of silicon grown on the top of the wafer 210. The circuit area 214 is formed proximate to the via 215. As part of the circuit area formation process, insulation layer 201 is formed over circuit area 214 and via 215 and contacts 202 to device regions (not shown) and vias are made. Subsequent steps form layers of first and second metal 225, 226, respectively. The first and second levels of metal are separated by an interlevel dielectric layer 227, such layer comprising silicon dioxide, for example. A passivation layer 228 covers the first and second metal layers 225, 226. As shown in FIG. 2B, the first level metal layer 225 contacts the polysilicon 217 that fills the via 215 at contact region 202. A portion of the circuit area 214 (not shown) is contacted by the first level metal layer 225 and is generally an input/output terminal (also not shown).

Figure 2C:
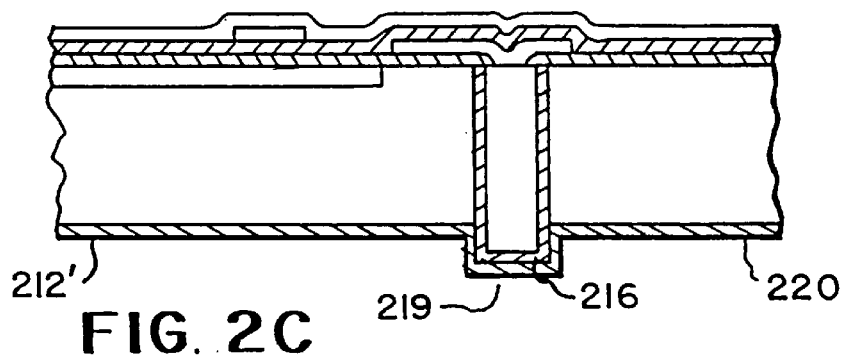
Figure 2D:
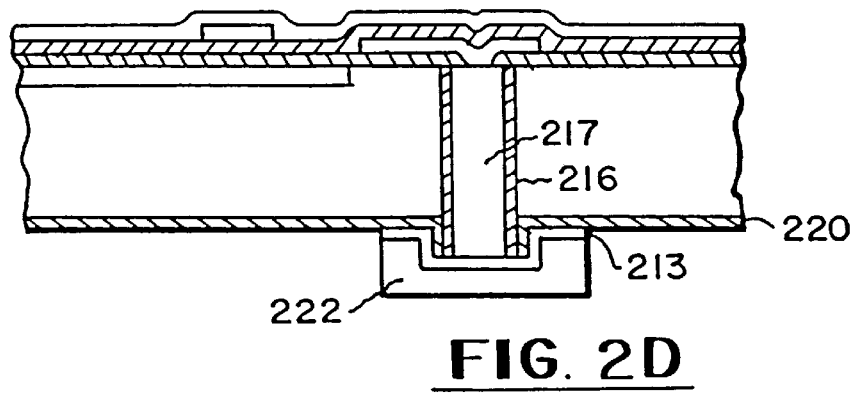

As a next step shown in FIG. 2C, the second surface 212 of the bulk wafer 210 is etched by a suitable etchant, such as KOH. This etching removes enough of the bulk silicon away from the second surface 212 in order to expose the side wall oxide 216 that fills the second end 219 of the via 215. The new second surface 212' is then coated with a deposited oxide 220. The deposited oxide 220 is of uniform thickness and passivates the new second surface 212' of the bulk wafer 210. Turning to FIG. 2D, the side wall oxide 216 in the bottom of the via 215 and a portion of the deposited oxide 220 are removed from the second end 219 of the via 215 by a process such as 'backtouching' which uses mechanical polishing to expose the polysilicon 216. Next, barrier and adhesion metal layer 213 is deposited over the exposed portion of the via, including the exposed end of the polysilicon material 217. On top of the barrier and adhesion metals layer 213 there is deposited either a gold or a solder bump 222. The gold or solder bump 222 is generally deposited through a photoresist mask (not shown). After deposition of the gold or solder bump 222, the barrier and adhesion metal layer 213 overlying the backside passivation oxide layer 220 is removed resulting in the structure shown in FIG. 2D.

It should be noted that this second embodiment of the invention can also utilize a bonded wafer substrate rather than a bulk substrate. In a bonded wafer the via 215 extends past the bond oxide to form a structure analogous to that formed in the first embodiment.

THIRD PREFERRED EMBODIMENT OF THE INVENTION

Figure 3:
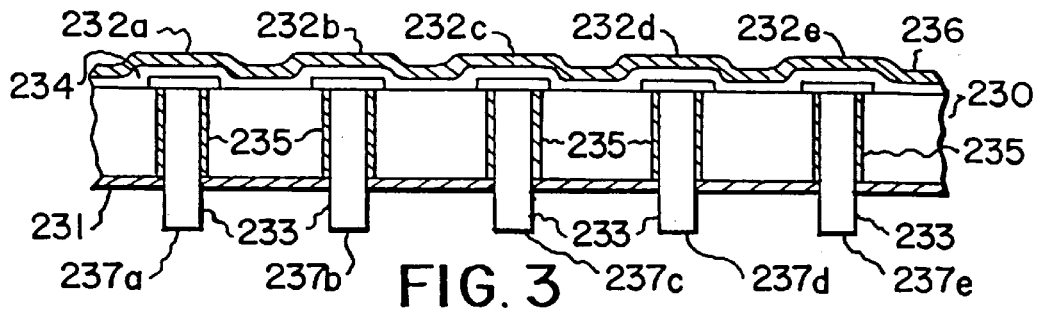
FIG. 3 illustrates a section view of a third embodiment of the invention where a plurality of through vias are filled with metal which extends from the backside of the integrated circuit die.

One of the features of the invention is that the filled through via interconnect may be extended from the backside of the die in the form of lengths of metal of predetermined length which form connection pins. With reference to FIG. 3, there a wafer 230 has a plurality of vias 232a–e. Each via is filled with a metal 233. The via is coated with a sidewall oxide 235. The portions 237a–e of the metal 233 that extend beyond the backside oxide surface 231 to form a plurality of pins for connecting the wafer 230 into a socket (not shown) that has a plurality of receptacles for receiving the pins 237a–e. The metal 233 of each pin 237a–e is coupled to an interconnect metal layer 234 which in turn is coupled to a circuit area (not shown). A passivation or oxide layer 236 covers the topside metal interconnects 234. Pins 237a–e are about 4 mils in diameter and about 40 mils in length.

FOURTH EMBODIMENT OF THE INVENTION

A fourth embodiment of the invention is illustrated in FIGS. 4A–4D. In the fourth embodiment of the invention, the vias are formed as receptacles for receiving metal contacts from either a PC board or from another die having extending pins, such as the pins 237 that extend from the bulk wafer 230 as shown in FIG. 3.

Figure 4A:
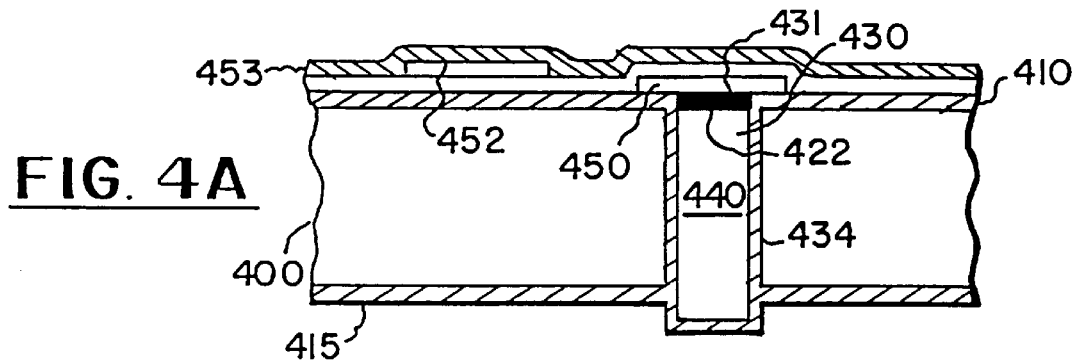
FIGS. 4A to 4F show section views of an integrated circuit die processed according to a fourth embodiment of the invention.
Figure 4B:
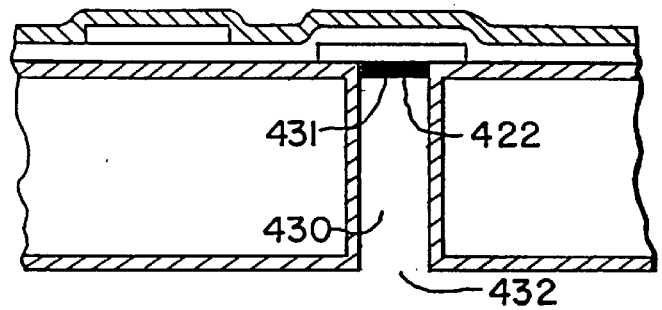

Turning now to FIGS. 4A–4D a device wafer 400 has a via 430 with a sidewall oxide 434 filled with polysilicon 440. Prior to forming first and second level metal layers 450, 452, the first end 431 of the polysilicon material 440 is silicided, forming silicide region 422. Passivation layer 453 is deposited over the first and second metal levels 450, 452. The handle wafer (not shown) is removed as discussed in connection with the first preferred embodiment. The bond oxide 415 and sidewall oxide 434 are etched with HF exposing the second end 432 of polysilicon 440 but leaving a residual portion of the bond oxide (this is facilitated by adjusting the sidewall 434 oxide thickness to be sufficiently thinner than the bond oxide 415 thickness), as shown in FIG. 4B. A silicon etchant removes the polysilicon material 440 from the via 430. The etch for example, KOH will stop on the silicide surface 422 that covers the first level metal 450 over the first end 431 of via 430.

Figure 4C:
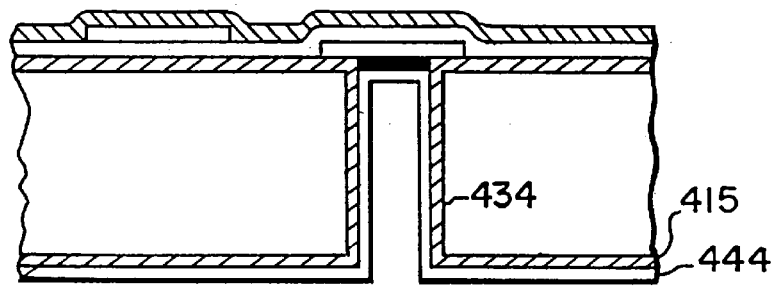
Figure 4D:
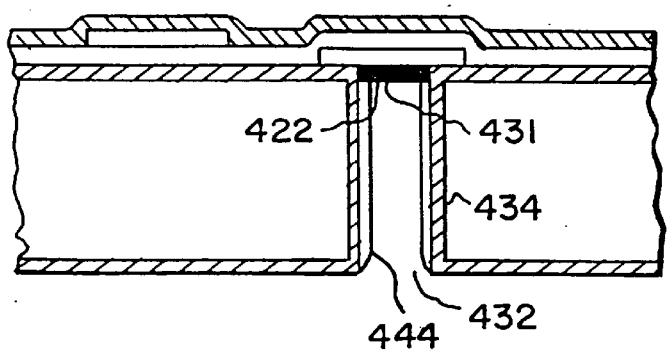
Figure 4E:
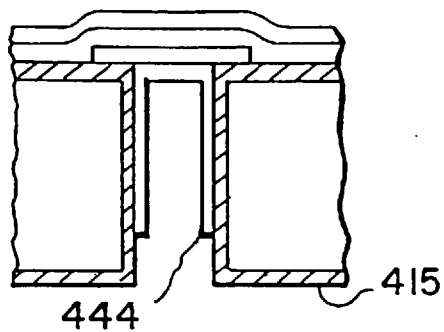
Figure 4F:
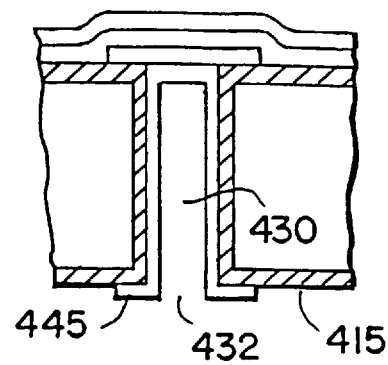

After the KOH etch, as shown in FIG. 4C a suitable metal such as tungsten or aluminum is deposited via chemical vapor deposition in a uniform layer 444 over the bond oxide 415 and sidewall oxide 434. The CVD metal layer 444 is etched using a dry plasma etch to remove the CVD metal 444 from the bond oxide 115 and leave the CVD metal 444 coating the sidewall oxide 434 of the via 430 as shown in FIG. 4D. As such, the via 430 now provides a backside opening at its second end 432 for receiving a metal conductor. The metal conductor may be a pin on a printed circuit board or may be a pin such as pin 237a–e of another die. As an alternative to the plasma etching of CVD metal 444, a positive photoresist may be applied on top of CVD metal 444 filling the backside openings. Subsequent exposure to UV and developing processing removes the softened portion of the photoresist. The remaining photoresist acts to protect CVD metal 444 in the via during a wet etch step which removes unwanted CVD metal 444 overlying bond oxide 415 regions. The remaining CVD metal 444, as shown in FIG. 4E, may be reduced to a predetermined distance beneath the oxide layer 415. As a further alternative, the CVD metal layer may be patterned to provide a portion of CVD metal 445 overlapping the oxide layer 415 in a region surrounding the second end 432 of the via 430 as shown in FIG. 4F.

FIFTH EMBODIMENT OF THE INVENTION

Figure 4G:
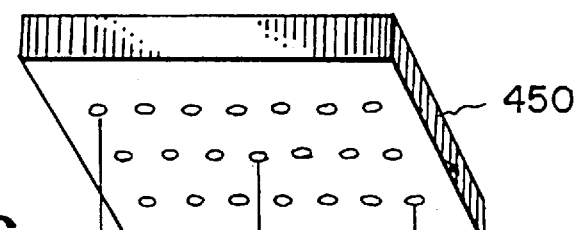
FIG. 4G illustrates in perspective view an integrated circuit die which has a plurality of receptacles formed on its back surface. Also shown is a substrate with a plurality of interconnect pins which are spaced so as to plug into corresponding receptacles on the integrated circuit die.

With reference to FIG. 4G a die 450 manufactured in accordance with the description of the fourth embodiment may be plugged into another die or substrate 452 manufactured in accordance with the description of the third embodiment. As such, the die 450 has receptacle vias with predetermined depths and conductive sidewalls. In a similar manner, the die 452 or corresponding circuit board has pins that are arranged to be insertable into and make electrical contact with the sidewalls of the vias in die 450. When the die 452 is inserted into the vias of die 450, the pins on die 452 provide an interference fit with the inside metal surface of the vias of the die on 450 resulting in a good electrical contact of the pin connections. Depending upon the materials used for the via pins and the via receptacles, it may be possible to remove and replace one or more defective dies 450, from the substrate 452. Those skilled in the art will also appreciate that one die may have both pins and receptacle vias and that one via may have a pin at one end and a receptacle at the other end of a via.

SIXTH EMBODIMENT OF THE INVENTION

Figure 4H:
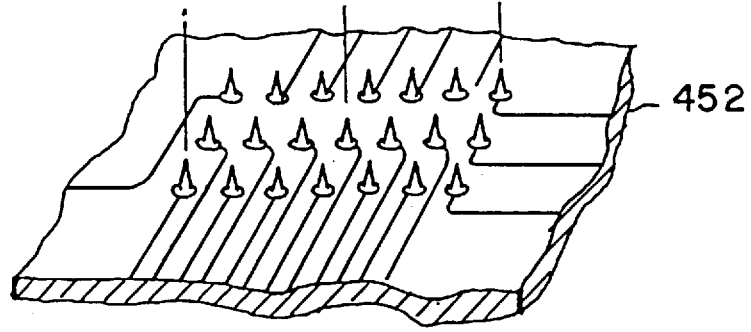
FIGS. 4H and 4I show section views of two processing variants to the fourth embodiment. These section views correspond roughly to FIG. 4-2.
Figure 4H:
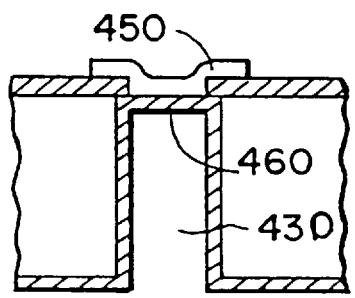
Figure 4I:
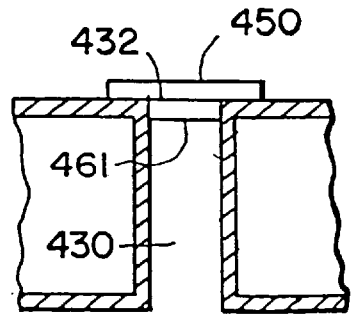
Figure 4J:
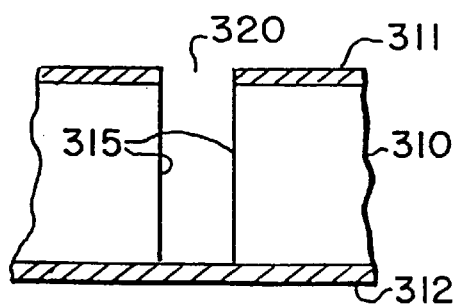
FIGS. 4J to 4N show section views of a seventh embodiment of the invention.

Further variants of the fourth embodiment are shown in FIGS. 4H and 4I. For simplicity, the dual level metal and passivating layers are not shown in these figures. If, prior to the first metalization layer 450 deposition and patterning, a thin oxide 460 is grown or deposited onto the polysilicon via refill, the oxide 460 will stop the subsequent KOH etch used to remove the polysilicon refill from via 430, FIG. 4H. Now, however, a short oxide etch is needed to remove oxide 460 prior to deposition of the CVD metal 444 so that good electrical contact is made from CVD metal 444 to first metalization layer 450. Care is taken during processing to make sure that the thickness of oxide layer 460 is less than the thickness of side wall oxide 434 and remaining portions of bond oxide 415. Another variant, shown in FIG. 4I utilizes a doped region 461 of the polysilicon refill which is not removed during the subsequent KOH etch of the polysilicon refill. The doped polysilicon 461 has a different selectivity with respect to an etchant than does undoped polysilicon. As such, the via 430 can be initially filled with undoped polysilicon. At the end of the filling process, dopant may be added to the process in order to change the etching characteristics of the polysilicon 461 in the via 430 at the first end 432.

SEVENTH EMBODIMENT OF THE INVENTION

The seventh embodiment of the invention is shown in FIGS. 4J–4N. In the seventh embodiment of the invention, a receptacle-type via is formed in a bulk wafer 310, FIG. 4J. The bulk wafer 310 has a top oxide layer 311 and a bottom oxide layer 312. A via 320 is formed through the top oxide layer 311 and the bulk wafer 310. The via 320 initially stops on the bottom oxide layer 312.

Figure 4K:
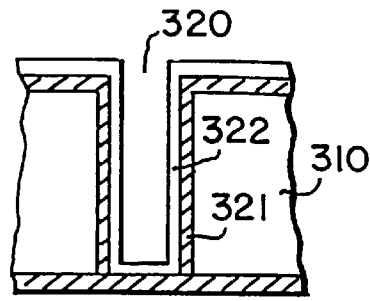

As shown in FIG. 4K, a following step includes the formation of a sidewall oxide layer 321 on the sidewalls 315 of via 320. Sidewall oxide 321 may be formed using a thermal oxidation process or a deposited oxide or a combination thereof. Next, a layer of polysilicon 322 is deposited by low pressure chemical vapor deposition. The polysilicon layer 322 is N+doped using POCl₃ for doping the polysilicon material.

Figure 4L:
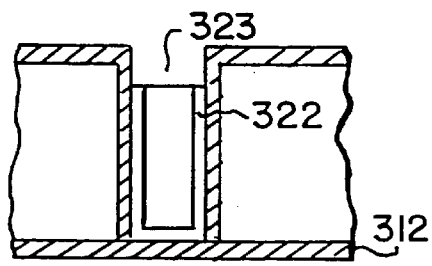
Figure 4M:
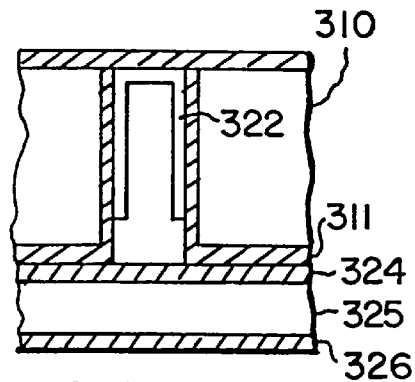

As a following step, a layer of photoresist 323 is deposited, UV exposed and developed resulting in a protective plug in the via 320. The photoresist 323 is a positive photoresist. As such, the photoresist layer is UV exposed to a controlled depth. The softened photoresist due to UV exposure is removed by a suitable development process. After removal of the UV exposed photoresist, the polysilicon layer 332 is removed by etching to leave a portion of the polysilicon layer 332 which is protected by the hardened photoresist 323 in the via 320, as shown in FIG. 4L. The hardened photoresist 323 remaining in the via 320 is removed and the wafer 310 is oxide bonded to a handle wafer 325. An oxide bonding layer 324 provides the bonding between the top oxide surface 311 and the handle wafer 325. An oxide layer 326 covers the other surface of the handle wafer 325, shown in FIG. 4M. As such, the last step provides receptacle vias in a bonded wafer. The bonded wafer is then suitably processed to provide integrated circuit regions (not shown) adjacent to the vias 320. The vias 320 are contacted by a first level of metal 327. The first metal 327 contacts the polysilicon layer 322 that covers the sidewalls of the via 320. An interlevel dielectric 328 and a second level metal 329 along with the passivation layer 336 cover the devices on bulk wafer 310. After suitable processing, the handle wafer 325 and the bonding oxide layer 324 are removed to provide a via 320 with one end 318 open on the second surface 317 of bulk wafer 310. The first surface 316 of bulk wafer 310 contains the integrated circuit devices (not shown).

Figure 4N:
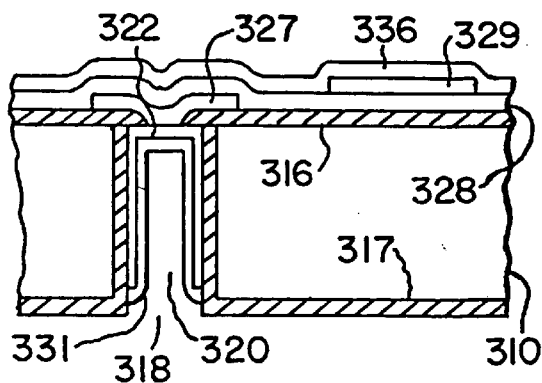

During the above process, the polysilicon layer 322 is only minimally oxidized, and any surface oxidation of the polysilicon layer 322 is removed during the removal of the bonding oxide 324. The final structure is shown in FIG. 4N has receptacle type vias 320. The inside surface of the polysilicon 322 may be coated with suitable metal for improving electrical contact. The metal coating 331 may be either gold or nickel, applied by electroless plating, for example.

Figure 4P:
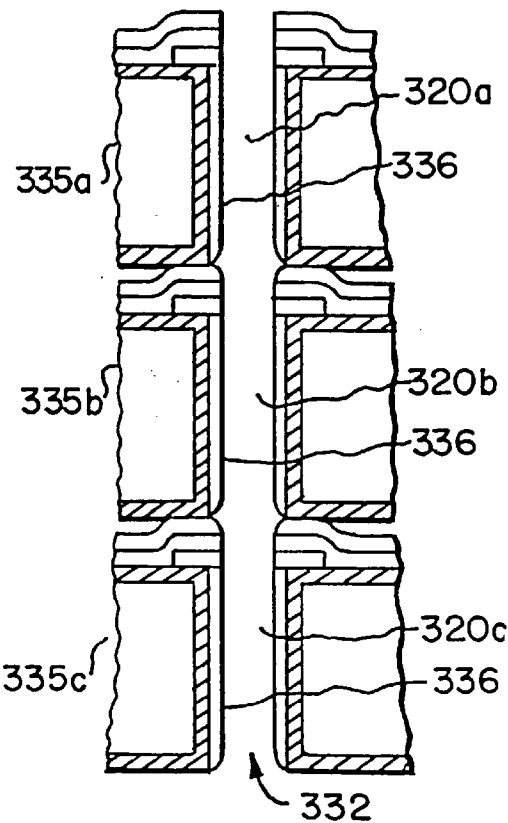
FIG. 4P illustrates a section view of a variation of the seventh embodiment of the invention.

One variation of the seventh embodiment is shown in FIG. 4P. In this embodiment, there are shown multiple dice 335A, 335B, 335C, etc. stacked one on top of the other. Each die has a through via 320a, 320b, 320c formed by the process described above. However, in addition to the above process, the first end of the via is also open so that the vias 320A, 320B, 320C, etc. when stacked one on top of the other provide a through passage 332. The individual die 335A–335C are aligned so that the vias 320A–320C form the continuous through passage 332. The passage 332 may then be plated or otherwise filled with a conductive material which contacts the polysilicon 336 to provide interconnection between the dice 335A–335C.

In the illustrated example, the metal one and metal two layers 327, 329 as well as the interlevel dielectric layer 328 and the passivation layer 330 is removed from the first end 319 of the through via. Those skilled in the art will appreciate that the material that is removed may be either the polysilicon material or tungsten or other metal material. The passivation layer 330, interlevel dielectric layer 328, and first and second metal layers 327, 329 over the first ends 319 of the vias 320 are removed through suitable masking and etching. Once the vias 320 are aligned, the vias 320A–320C may be interconnected using electroless plating, flowing of conductive paint, threading of metal wires, or any other suitable interconnection mechanism.

EIGHTH EMBODIMENT OF THE INVENTION

Figure 5:
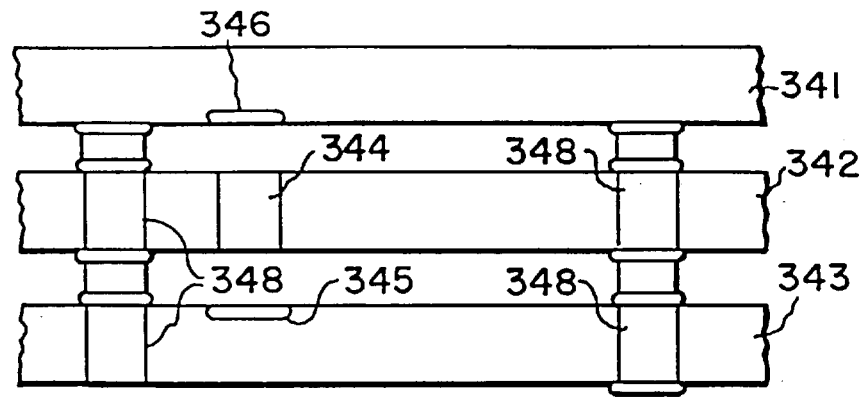
FIG. 5 shows a section view of an eighth embodiment of the invention where multiple integrated circuit die are interconnected by stacking one die upon the next. Both electrical and optical interconnections are shown.

With reference to FIG. 5, there is shown an alternative method for interconnecting a plurality of dice having vias extending through the die. In this technique, dice 341, 342, 343 are interconnected by electrically conductive vias 348 and an optically conductive via 344. The electrically conductive vias 348 are formed and interconnected in accordance with the above description of multiple via interconnections. The center die 342 is provided with a via 344 that is filled with an optically conductive material, such as fiber optic material. Via 344 may optionally be left unfilled, providing an 'air-filled' connection. The optically conductive via 344 is disposed opposite a photoreceiver 345 on die 343 opposite one end of via 344 and a phototransmitting device 346 opposite the other end of via 344 and disposed in die 341. Thus, light emitted by the optical transmitter 346, such as a laser or a light emitting diode, is conducted by the fiber optic material in optically conductive via 344 and coupled to the optical receiver 345, such as a photodiode or photosensor. As such, the above described embodiment of the invention, multiple dice 341–343 have vias 348 for electrically connecting the dies 341–343 as well as one or more optical vias 344 that interconnects the dies 341 and 343. Those skilled in the art will appreciate that further combinations of electrical and optical vias may be made apart from the particular example described above.

NINTH EMBODIMENT OF THE INVENTION

Figure 6:
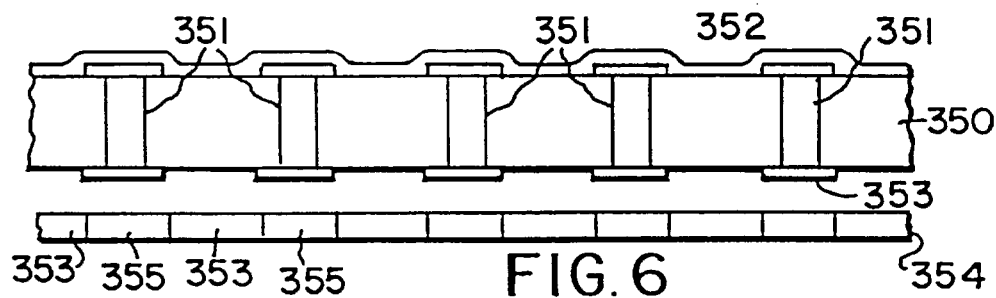
FIG. 6 illustrates a section view of a ninth embodiment of the invention in which a interposer is provided to furnish the contact metalization for the conductive through vias.

The conductive vias of the invention may also be used in combination with an interposer to provide a two-piece interconnection system for an integrated circuit. With reference to FIG. 6, there is shown a die 350 with a plurality of vias 351 having conductive fillings and/or conductive side walls that electrically couple one end of the via 352, such as a bond pad 352 to another end of the via 353 which includes a second, metal pad. The die 350 may be formed in accordance with one or more of the above disclosed embodiments of the invention. The die 350 are mounted onto a interposer 354. Each interposer 354 comprises a dielectric material 353 with contact metal inserts 355. The interposer 354 has several advantages. With the above described system, the metal pads 353 formed on the backside of the die 350 are easier to form and less expensive. In addition, the interposer 354 fills up the dead space beneath the die 350 and keeps the area free from fluxes used as cleaning agents that would normally be used in multi-chip module fabrication. The interposer material 354 may include dielectric material such as diamond which would conduct heat away from the die 350. In addition, it is noted that electroless plating could be used on the backside of die 350 so that a masking operation required to form the metal pads of 353 could be eliminated.

TENTH EMBODIMENT OF THE INVENTION

Figure 7:
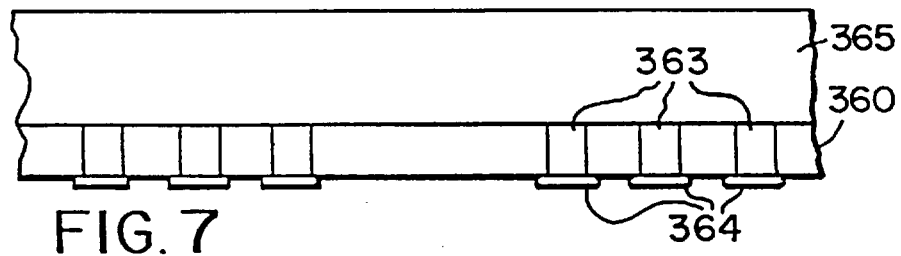
FIG. 7 illustrates a section view of a tenth embodiment of the invention in which a very thin integrated circuit die is stabilized and held rigid by a supportive layer applied to the frontside of the die.

One of the features of the invention is the provision of vias in very thin die 360, i.e., die having a thickness of 10–40 microns. In this embodiment of the invention, the 10–40 micron thick device wafer is oxide bonded to a handle wafer. A trench etch is used to form the through vias through the device wafer and bond oxide, stopping on the handle wafer. However, prior to removal of the handle wafer, the device wafer receives an overcoat on its front side in order to stabilize and add rigidity. The overcoat layer 365 is shown in FIG. 7. For simplicity, features such as metalization layers, interlevel dielectrics, and passivation layers are not shown in FIG. 7. The overcoat 365 may comprise any suitable materials such as plastic, glass, polyamide, or even metal. After application of the overcoat 365, the handle wafer is removed to form the structure appearing in FIG. 7. There, the die 360 has a plurality of vias 363, each with a bond pad 364 on the backside surface of the die 360. Of course, those skilled in the art will see that the vias 363 may also be formed as receptacle vias as disclosed in connection with the above embodiments of the invention.

ELEVENTH EMBODIMENT OF THE INVENTION

Figure 8A:
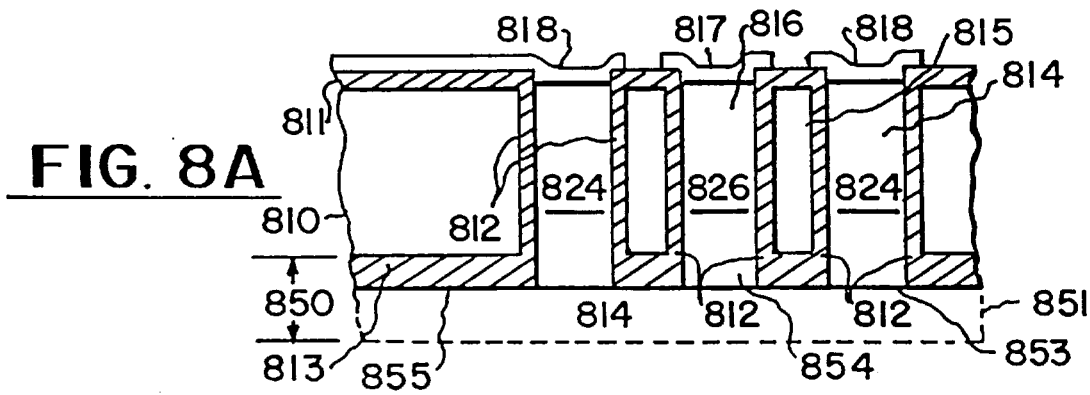
FIGS. 8A and 8B show section and plan views, respectively, of an eleventh embodiment of the invention.
Figure 8B:
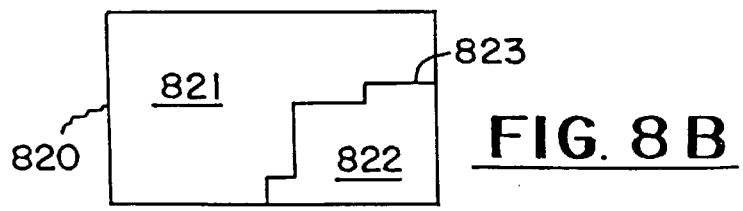

Another embodiment of the invention provides for coaxial connection and for shielding of a digital section of a die from an analog section. With reference to FIGS. 8A–8B, there is shown a device die 810 with a top oxide layer 811, bottom oxide layer 813 and inner via 816. The inner via 816 is filled with a conductive material 826. The conductive material 826 is separated from the adjoining annular die material 815 by a sidewall oxide 812. An outer, annular via 814 encloses the inner via 816. The outer via 814 is likewise filled with conductive material 824. The conductive material 824 is insulated from the adjoining device material by suitable sidewall oxide 812. An inner contact 817 carries a signal to the conductive material 826 of the inner via 816. An outer annular contact 818, generally coupled to ground, is also connected to the annular conductive material 824 that surrounds the inner material 826. Thus, the above described embodiment provides a coaxial connection with a cylindrical grounded metal conductor 824 surrounding a signal carrying central conductor 826. With the above embodiment, noise and induced electromagnetic fields resulting from changing signal levels in the inner conductor 826 are effectively shielded from the circuit areas that are formed in the die 810 outside the annular via 814. The metal filling the vias 814, 816 may be tungsten or other suitable material. While the outer annular vias shown in a circular configuration, those skilled in the art will appreciate that the outer annular via 814 may have any suitable geometric configuration so long as it encloses or otherwise electrically shields the inner via 816. Thus, the shape of the outer annular via 814 may be a square, a rectangular, a pentagon, or any other suitable shape.

To form the coaxial vias 814, 816 a single wafer or a bonded wafer may be used. If a single wafer is used the bottom of the wafer 810 is provided with an oxide layer 850. If a boned wafer is used, layer 850 may be the bond oxide layer on top of a handle wafer. The vias 814, 816 are etched a controlled distance into the wafer 810 and stop in the bottom oxide layer 813. At a suitable time a portion of the wafer 851 is removed to expose the second ends 853, 854 of the conductive vias on the second surface 855 of the wafer 810. The portion 850 would be a handle wafer in a bonded wafer embodiment.

The above coaxial feature may also be used to separate an entire analog section of a die from a digital section. With reference to FIG. 8B, there is shown a die 820 with a digital section 821 and an analog section 822. A wall 823 separates the digital section 821 from the analog section 822. The wall comprises a suitable via or trench that extends from the top surface of the die to the bottom surface of the die. The sidewalls of the trench are oxidized and the trench is filled with a suitable conductive material, preferably metal. The conductive material inside the wall 823 is connected via a suitable terminal to a ground connection and thereby provides a ground shield wall between the analog section 822 and the digital section 821.

TWELFTH EMBODIMENT OF THE INVENTION

Figure 9A:
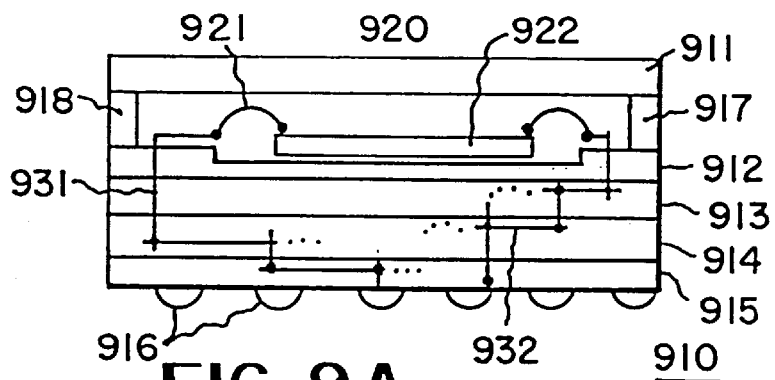
FIG. 9A shows a section view of a prior art multilayer ceramic package.

With reference to FIG. 9A, there is shown a prior art ceramic package 910 with multiple layers 912–915 of co-fired ceramic and interconnects 931, 932. Signals on the packaged chip 920 are conducted via bond wires 921, 922 and interconnects 931, 932 to a ball grid array 916 disposed on the outside surface of the lowest layer 915. The package 910 has internal shoulders 918, 917 that support a lid 911.

Figure 9B:
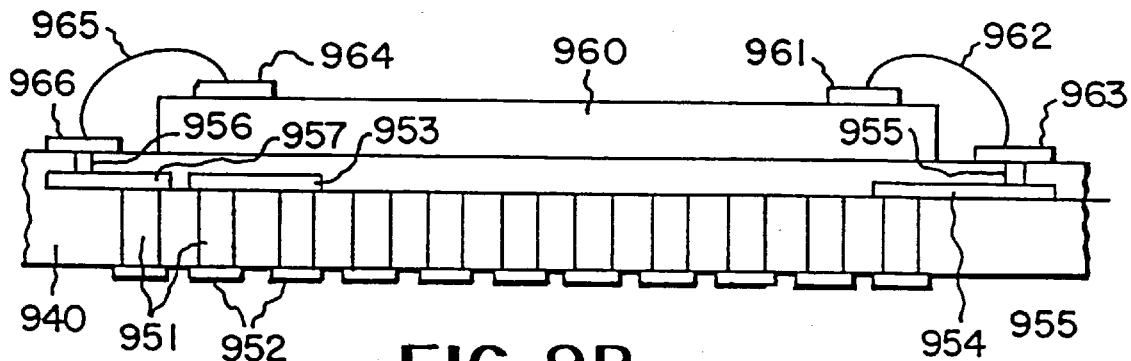
FIG. 9B shows a section view of a twelfth embodiment of the invention.

With references to FIG. 9B, a package 950 using the invention could replace the multiple ceramic layers of package 910. In the package 950 a substrate 940 has an array of conductive vias 951 terminating in an external connection array 952 which may be flat or ball shaped like the array 916 of package 910. Individual through vias in the external connection array 952 are contacted by metalization layer 953, 954, 957, etc. and conductive vias 955, 956 to bondpads 963, 966 which are electrically connected to bondpads 964, 961 on the integrated circuit die 960 using bondwires 962, 965. While the FIG. 9B shows only a few layers of interconnect (957 and 966, for example), those skilled in the art will appreciate that additional interconnect and via layers may be used to route the through via connections 951 to the appropriate bondpad 966, for instance. As such, a package 950 including multiple interconnection layers of metalization, 957, 966 would replace the multiple layers of co-fired ceramic 912–915 and interconnect 931, 932 of package 910.

THIRTEENTH EMBODIMENT OF THE INVENTION

Figure 9C:
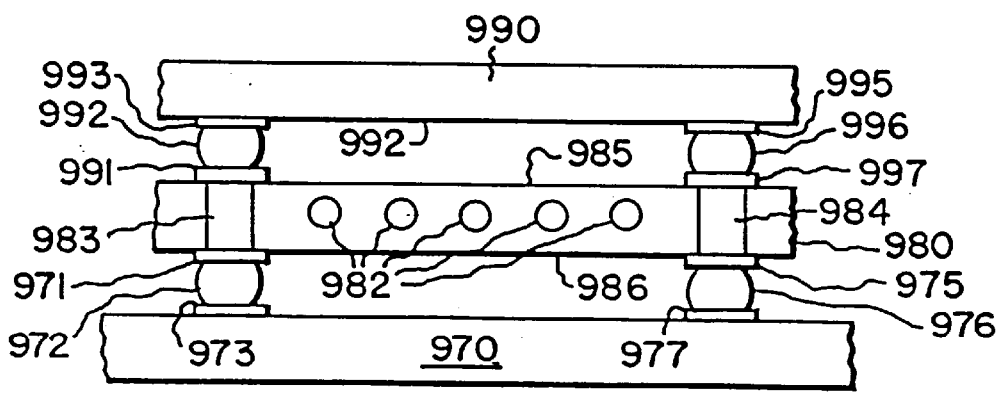
FIG. 9C illustrates a section view of a further embodiment of the stacked die illustrated in FIG. 4D and FIG. 5.

As a further embodiment of the stacked die illustrated in FIGS. 4P and 5, a chip cooler substrate 980 is shown in FIG. 9C. The chip cooler substrate 980 has a plurality of coolant passageways 982 disposed in a plane parallel to the opposite surfaces 985, 986 of cooler substrate 980. A suitable coolant fluid is circulated through the passageways 982 for removing heat from the cooler substrate 980. An integrated circuit die 990 is mounted above one surface 985. The cooler substrate 980 has conductive vias 983, 984. A support substrate 970 has a number of connection pads 973, 977. One connection between the support substrate and the integrated circuit 990 uses an interconnect 973 on the surface of support substrate 970. A ball connection 972 electrically connects pad 973 to pad 971. A conductive via 983 connects pad 971 on lower surface 986 to pad 991 on upper surface 985. A similar pad/ball connection 991, 992, 993 completes connection of pad 973 to an input/output pad 993 of integrated circuit 990. A similar connection exists between support pad 977 and input/output pad 995.

In the illustrated example of FIG. 9C the coolant passageways 982 are uniformly distributed through the cooler substrate 980. Heat radiated by the integrated circuit 990 is absorbed by coolant fluid and carried away. As a further improvement, a thermal conductive material, such as a metal, could be placed in contact with surface 985 of cooler substrate 980 and lower surface 992 of integrated circuit 990. As another alternative, a thermally conductive interposer could be used.

Although the present invention has been described and illustrated in detail, it is to be clearly understood that the same is by way of illustration and example only, and is not to be taken by way of limitation. The spirit and scope of the present invention are to be limited only by the terms of the appended claims.

What I claim:

1. An integrated circuit with a coaxial via comprising:
    a wafer of semiconductor material with first and second surfaces and with integrated circuits formed on the first surface of said wafer;
    a first via comprising inner and outer walls spaced from each other and extending from a first open end on the first surface of the wafer to a second open end on the second surface of the second surface, said inner wall of said first via enclosing a portion of said wafer;
    a second via in the portion of the wafer enclosed by said inner wall of said first via, said second via having a first open end on the first surface of the wafer, an elongated, open passage extending to a second open end of the via on the second surface
    a dielectric surface on each wall of the vias; and
    a conductive material filling said vias.

2. The integrated circuit of claim 1 wherein the conductive material is one selected from the group consisting of doped polysilicon and tungsten.

3. An integrated circuit with digital and analog circuits comprising:
    a wafer of semiconductor material with first and second surfaces and with said analog circuits formed in a first area of the first surface of said wafer and with said digital circuits formed in a second area of the first surface of said wafer;
    a trench for electrically separating the first area from the second area, said trench having spaced apart side walls extending from the first surface of the wafer to the second surface of the wafer;
    a dielectric coating on said trench sidewalls;
    a conductive material filling said trench between said sidewalls.

4. The integrated circuit of claim 3 wherein the conductive material is one selected from the group consisting of metal and doped polysilicon.

5. The integrated circuit of claim 3 wherein the conductive material filling the trench is coupled to a reference potential.

6. The integrated circuit of claim 5 wherein the reference potential is ground.

* * * * *